(12) United States Patent
Hobbs et al.

(10) Patent No.: US 6,886,573 B2
(45) Date of Patent: May 3, 2005

(54) PLASMA CLEANING GAS WITH LOWER GLOBAL WARMING POTENTIAL THAN $SF_6$

(75) Inventors: John Peter Hobbs, Lansdale, PA (US); James Joseph Hart, Fogelsville, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 398 days.

(21) Appl. No.: 10/237,224

(22) Filed: Sep. 6, 2002

(65) Prior Publication Data

US 2004/0045576 A1 Mar. 11, 2004

(51) Int. Cl.⁷ .................................................. B08B 9/00
(52) U.S. Cl. ........................ 134/22.1; 134/1.1; 134/31; 134/902; 216/64; 216/67; 438/905
(58) Field of Search ............................... 134/1.1, 22.1, 134/31, 902; 216/64, 67; 438/905

(56) References Cited

U.S. PATENT DOCUMENTS

| | | | |
|---|---|---|---|
| 4,687,543 A | * 8/1987 | Bowker | 438/733 |
| 4,975,144 A | 12/1990 | Yamazaki | 156/643 |
| 5,009,963 A | 4/1991 | Ohmi et al. | 428/472 |
| 5,114,834 A | 5/1992 | Nachshon et al. | 430/329 |
| 5,211,790 A | 5/1993 | Tatsumi | 156/662 |
| 5,217,570 A | 6/1993 | Kadomura | 156/665 |
| 5,227,337 A | 7/1993 | Kadomura | 437/192 |
| 5,228,950 A | 7/1993 | Webb et al. | 156/643 |
| 5,254,176 A | 10/1993 | Ibuka et al. | 134/2 |
| 5,310,456 A | 5/1994 | Kadomura | 156/657 |
| 5,312,518 A | 5/1994 | Kadomura | 156/662 |
| 5,314,576 A | 5/1994 | Kadomura | 156/655 |
| 5,326,431 A | 7/1994 | Kadomura | 156/659 |
| 5,354,421 A | 10/1994 | Tatsumi et al. | 156/662 |
| 5,360,510 A | 11/1994 | Kadomura | 156/665 |
| 5,368,686 A | 11/1994 | Tatsumi et al. | 156/656 |
| 5,376,234 A | 12/1994 | Yanagida | 156/662 |
| 5,378,653 A | 1/1995 | Yanagida | 437/194 |
| 5,445,712 A | 8/1995 | Yanagida | 156/662 |
| 5,507,874 A | 4/1996 | Su et al. | 134/1 |
| 5,565,038 A | 10/1996 | Ashley | 134/2 |
| 5,698,070 A | 12/1997 | Hirado et al. | 156/643 |
| 5,783,492 A | 7/1998 | Higuchi et al. | 438/710 |
| 5,817,578 A | 10/1998 | Ogawa | 438/714 |
| 5,855,689 A | 1/1999 | Akiyama | 134/1.1 |
| 5,868,853 A | 2/1999 | Chen et al. | 134/1.1 |
| 6,242,359 B1 | 6/2001 | Misra | 438/710 |
| 6,583,065 B1 * | 6/2003 | Williams et al. | 438/714 |

FOREIGN PATENT DOCUMENTS

| | | | |
|---|---|---|---|
| EP | 516053 | 2/1999 | .......... H01L/21/311 |
| EP | 1138802 | 10/2001 | ........... C23C/16/44 |
| GB | 2305940 | 4/1997 | ........... C23C/16/50 |
| JP | 2302165 | 12/1990 | .......... H04N/1/028 |
| JP | 4243129 | 8/1992 | ........... H01L/21/28 |
| JP | 4261017 | 9/1992 | .......... H01L/21/302 |
| JP | 136104 | 6/1993 | .......... H01L/21/302 |
| JP | 5558 | 1/1994 | .......... H01L/21/302 |
| JP | 104223 | 4/1994 | .......... H01L/21/302 |
| JP | 201819 | 8/1995 | .......... H01L/21/302 |
| JP | 134911 | 5/1997 | ........... H01L/21/31 |
| JP | 144792 | 5/1998 | .......... H01L/21/768 |
| WO | 0207194 | 1/2002 | ........... H01L/21/00 |

OTHER PUBLICATIONS

"Applications of Plasma Processes to VLSI Technology," T. Sugano, John Wiley & Sons, 1980, pp. 102–215.

* cited by examiner

*Primary Examiner*—M. Kornakov
(74) *Attorney, Agent, or Firm*—Geoffrey L. Chase

(57) ABSTRACT

A process for cleaning a deposit from an interior surface of a processing chamber includes generating a plasma from a cleaning gas including $SO_2F_2$ and contacting the interior surface with the plasma for a time sufficient to convert the deposit into a volatile product, thereby cleaning the deposit from the interior surface, in which the process is conducted in the absence of $SF_6$. The deposits, which may be removed by the process of the invention, include silicone, silicone oxide, silicone nitride, tungsten, copper and aluminum.

13 Claims, No Drawings

PLASMA CLEANING GAS WITH LOWER GLOBAL WARMING POTENTIAL THAN $SF_6$

BACKGROUND OF THE INVENTION

This invention relates to a method of removing residue from an interior of a process chamber, and more particularly, to a method of using environmentally friendly gases to remove unwanted deposits from a process chamber for making electronic devices.

In the electronics industry, vacuum processes chambers are frequently used for making electronic devices. Unused reagents and byproducts of deposition or etch processes are usually exhausted from the chamber, but not residues deposited on the walls and other surfaces inside the chamber. Residues comprising substances like silicone, silicone oxide, silicone nitride and/or tungsten are formed during a process of fabricating semiconductor layers for electronic devices, for example, during fabricating thin film transistor (TFT) flat panel displays, microelectromechanical systems (MEMS), as well as during processes for chemical vapor deposition (CVD) of a film. To maintain quality and consistency of electronic devices being fabricated, these residues have to be removed from the surfaces on which they are coated to prevent them from flaking-off and contaminating the electronic device itself. Many of the prior art methods and processes use perfluoro compounds (PFCs), such as $SF_6$, in plasma etching or reactive ion etching (RIE) thin films and cleaning plasma enhanced CVD chambers. A conventional method of cleaning unwanted residue is to introduce to a process chamber a gas containing radicals produced by plasma decomposition of PFCs, such as $SF_6$ or a mixture thereof with oxygen, argon or chloride.

However, the use of PFCs such as $SF_6$ is extremely damaging to the environment. PFCs and, in particular, $SF_6$ cause an irreversible atmospheric impact because they have extremely long atmospheric lifetimes (thousands of years) and high global warming potential values ($GWP_{100}$). International concern over global warming has focused attention on the long atmospheric life of $SF_6$ (about 3,200 years, compared to 50–200 years for $CO_2$) together with its high potency as a greenhouse gas (23,900 times the 100-year global warming potential ($GWP_{100}$) of $CO_2$ on a mole basis) and has resulted in a call for voluntary reductions in emissions. Because of this concern, the use of $SF_6$ is being restricted, and it is expected to be banned in the near future.

Prior art methods of cleaning a semiconductor processing chamber using $SF_6$ include the steps of removal of products of $SF_6$ decomposition such as $SO_2F_2$, as disclosed in WO 02/07194 A2 to Ohno et al. Ohno discloses the method of cleaning using a combination of SF6 with either $F_2$ or $NF_3$, wherein the decomposition or reaction products of these gases are removed in a decomposition step after the cleaning.

The U.S. Pat. No. 5,376,234 to Yanagida discloses a dry etching method for etching a silicon layer using an etching gas containing a fluorocarbon compound and, optionally, a halogen compound containing a sulfuryl group.

Other prior art methods of dealing with reducing or eliminating the release of global warming compounds include using molecular fluorine gas ($F_2$) as described by EP 1 138 802 A2 to Harshbarger et al. or carbonfluorides as described by the U.S. Pat. No. 6,242,359 B1to Misra.

However, molecular fluorine and carbonfluorides are relatively expensive and not very environmentally friendly. Fluorine systems require enhanced safety measures due to the reactivity of fluorine. This includes extensive cleaning and pre-passivation of the entire fluorine system.

Despite the foregoing developments, it is still desired to provide other cleaning gases with lower global warming potentials that can be easily decomposed after cleaning. It is further desired to have a process for plasma cleaning which overcomes the disadvantages of the prior art by reducing or eliminating the release of global warming compounds into the atmosphere.

All references cited herein are incorporated herein by reference in their entireties.

BRIEF SUMMARY OF THE INVENTION

The invention provides a process for cleaning a deposit from an interior surface of a processing chamber. The process comprises: generating a plasma from a cleaning gas comprising $SO_2F_2$ and contacting the interior surface with the plasma for a time sufficient to convert the deposit into a volatile product, thereby cleaning the deposit from the interior surface, wherein the cleaning process is conducted in the absence of $SF_6$. The deposits, which may be removed by the process of the invention, include but are not limited to silicone, silicone oxide, silicone nitride, tungsten, copper and aluminum.

DETAILED DESCRIPTION OF THE INVENTION

This invention provides a lower global warming alternative to using $SF_6$ or blends of $SF_6$ with oxygen as a cleaning gas in a plasma cleaning process to remove unwanted deposits formed in a processing chamber during various processes for making electronic devices, e.g., etching.

The process of the invention includes a step of generating a plasma from a cleaning gas comprising sulfuryl fluoride ($SO_2F_2$) or blends thereof with an inert gas. The plasma then contacts an interior surface of the processing chamber and any other surfaces located inside the processing chamber, wherein an unwanted deposit is formed during prior processes of making various electronic devices. Examples of such prior processes are etching or coating such as CVD.

During the cleaning process, the plasma contacts the interior surface of the processing chamber for a time sufficient to convert the deposit into a volatile product, thereby cleaning the deposit from the interior surface. The cleaning process of the present invention is conducted in the absence of $SF_6$.

The advantage of using $SO_2F_2$ is that it is more reactive than $SF_6$ and may decompose at lower energy level in the plasma requiring a lower temperature than that needed for $SF_6$ plasma. Moreover, $SO_2F_2$ is readily hydrolyzable, and any unreacted amounts can be easily disposed of in, for example, a caustic scrubber. Even if some amounts of $SO_2F_2$ were to escape during the cleaning process, they will eventually hydrolyze in the atmosphere without causing global warming effects as does the escaped $SF_6$ since $GWP_{100}$ of $SO_2F_2$ is about 1 as shown in Table 1 below.

TABLE 1

| Name | Formula | CAS Number[1] | OSHA PEL/ Ceiling/ Max Peak[2] | ACGIH TWA/ STEL[3] | GWP$_{100}$[4] | Atmospheric Lifetime years |
|---|---|---|---|---|---|---|
| Sulfur Hexafluoride | $SF_6$ | 2551-62-4 | 1,000/x/x | 1,000/ 1,250 | 24,900 | 3,200 |
| Sulfuryl Fluoride | $SO_2F_2$ | 2699-79-8 | 5/10/x | toxic | ~1 | NK[5] |

[1]"CAS" is Chemical Abstract Services.
[2]"OSHA" is Occupational Safety and Health Administration; and "PEL" is Permissible Exposure Limit in parts per million (ppm), 29 CFR 1910.1000.
[3]"ACGIH" is American Conference of Governmental Industrial Hygienists; "TWA" is Time Weighted Average in parts per million (ppm); and "STEL" is Short Term Exposure Limit in parts per million (ppm).
[4]"GWP$_{100}$" is Global Warming Potential relative to that of $CO_2$ estimated over 100 years; for example, the GWP$_{100}$ of $SF_6$ is 24,900 times the GWP$_{100}$ of $CO_2$. Applicants are not aware of any published data regarding the GWP's for the compounds for which the GWP$_{100}$ is indicated to be about 1.
[5]"not known (NK)"; the atmospheric lifetime of this compound is not known to the applicants, but is believed to be comparable to that of $CO_2$.

The process of the present invention can be practiced with any semiconductor processing apparatus known in the art. One example of such apparatus is disclosed in U.S. Pat. No. 6,242,359 B1 to Misra, but it should be understood that the apparatus disclosed by Mistra is merely exemplary and that the present invention is not deemed to be limited thereto.

An apparatus for making electronic devices can be a capacitively coupled system for performing CVD and/or etching processes wherein the etching process is conducted in a vacuum processing chamber using processing or depositing gases other than $SF_6$ or its blends with oxygen. If $SF_6$ or its blends with oxygen are used, the unreacted processing gas and any gases resulting from the decomposition thereof should be removed from the processing chamber prior to the cleaning process.

The processing chamber of the process of the present invention may be a vacuum processing tube or a container having any shape known in the art with an inner cavity suitable for carrying out various processes for making electronic devices (e.g., deposition or etching) during which various unwanted deposits are formed on the chamber's inner surfaces. The chamber should be capable of either generating a plasma inside of the chamber or holding a plasma generated in an auxiliary reactor separate from the processing chamber. The processing chamber can optionally contain a semiconductor wafer from a processing step conducted or to be conducted. That is, the cleaning method may be performed between CVD processes with or without wafers present in the processing chamber.

In certain embodiments, the cleaning gas consists essentially of $SO_2F_2$. In certain embodiments, the cleaning gas comprises at least 99% by volume of $SO_2F_2$. $SO_2F_2$ may contain HF, HCl, $Cl_2$, $SO_2$ and/or $C_2H_4Cl_2$ (ethylene dichloride) as impuritie resulted from a process of making $SO_2F_2$. The impurities preferably comprise not more than 1% of the cleaning gas by volume.

The cleaning gas comprising $SO_2F_2$ may be introduced into the processing chamber with an inert gas, such as argon or xenon, acting, for example, as a carrier gas. The inert gas can comprise, for example, between 0.1% and 10% by volume of the cleaning gas. A plasma is then formed from the introduced cleaning gas generating active species. Active species are contacted with the deposits formed on inner surfaces of the processing chamber forming volatile products, which are effectively removed together with any unreacted cleaning gas to, for example, a scrubber (not shown) for a decomposition process such as, for example, a hydrolysis.

The cleaning gas of the present invention and any additional gases such as an inert gas or a carrier gas may be introduced into the chamber through one or more inlets. The gas inlets are connected to respective sources for providing these gases to the processing chamber. The processing chamber may further contain an upper electrode and a lower electrode for generation plasma. Another embodiment of the process of the present invention includes generating the plasma in an auxiliary reactor separate from the processing chamber. For example, the wafer processing method itself may be a non-plasma process, e.g., a non-plasma low pressure CVD method. In this instance, the CVD processing apparatus could lack a plasma generator to affect the method of the present invention. Therefore, to effectuate the process of the present invention, the cleaning gas plasma must be first generated in the auxiliary reactor prior to being fed to the processing chamber.

Operating conditions of the processing chamber depend on various factors, for example, the type of deposit being removed and the type of plasma generation system being employed. While operating conditions can be determined by persons skilled in the art using this disclosure as a guide, preferred conditions can be summarized as follows:

Pressure: 50 mTorr (6.67 Pa) to 10 Torr (1.333 kPa);
RF power: 500 watts to 3000 watts;
$SO_2F_2$ flow rate: 100 sccm to 2000 sccm; and
Plasma temperature: 50° C. to 500° C.

Although the method of the present invention has been described with the reference to a capacitively coupled plasma generation system, the invention can be practiced with other types of plasma generation systems, such as inductively coupled plasma (ICP) based systems, and microwave plasma generation systems of the electron cyclotron resonance (ECR) or the non-ECR type. Non-limiting examples of plasma generation systems useful with the inventive method are described in Applications of Plasma Processes to VLSI Technology, T. Sugano, John Wiley & Sons, 1980, pp. 102–215, the contents of which are incorporated by reference herein.

The cleaning gas of the present invention can be used to remove dielectric or metal materials deposited during the CVD process on exposed surfaces of the processing chamber. Dielectric materials include, for example, doped and undoped silicon oxides, silicon nitride, and silicon oxynitride. As used herein, the terms "silicon oxide," "silicon nitride" and "silicon oxynitride" are intended to encompass both stoichiometric and non-stoichiometric type materials. Metal materials that can be removed include, for example, tungsten, aluminum and copper.

While the invention has been described in details and with reference to specific examples thereof, it will be apparent to one skilled in the art that various changes and modifications can be made therein without departing from the spirit and scope thereof.

What is claimed is:

1. A process for cleaning a deposit from an interior surface of a processing chamber, said process comprising:
    generating a plasma from a cleaning gas comprising $SO_2F_2$; and
    contacting the interior surface with the plasma for a time sufficient to convert the deposit into a volatile product, thereby cleaning the deposit from the interior surface, wherein the process is conducted in the absence of $SF_6$.

2. The process of claim 1, wherein said deposit is selected from the group consisting of silicone, silicone oxide and silicone nitride.

3. The process of claim 1, wherein said deposit is selected from the group consisting of tungsten, copper and aluminum.

4. The process of claim 1, wherein said cleaning gas consists essentially of $SO_2F_2$.

5. The process of claim 1, wherein said cleaning gas comprises at least 99% $SO_2F_2$ by volume.

6. The process of claim 1, wherein said cleaning gas contains not more than 1% impurities by volume, wherein said impurities are selected from the group consisting of HF, HCl, $Cl_2$, $SO_2$ and $C_2H_4Cl_2$.

7. The process of claim 1, wherein said cleaning gas further comprises at least one inert gas.

8. The process of claim 7, wherein said inert gas is argon or xenon.

9. The process of claim 7, wherein said inert gas comprises 0.1% to 10% by volume of said cleaning gas.

10. The process of claim 1, further comprising a step of removing the volatile product and any unreacted cleaning gas from the processing chamber.

11. The process of claim 10, further comprising a step of decomposing the unreacted cleaning gas by a hydrolysis.

12. The process of claim 1, wherein the plasma is generated in the processing chamber.

13. The process of claim 1, wherein the plasma is generated in an auxiliary reactor separate from the processing chamber.

* * * * *